(12) United States Patent
Matsubara et al.

(10) Patent No.: US 8,578,852 B2
(45) Date of Patent: Nov. 12, 2013

(54) BLOCK COPOLYMER COMPOSITION FOR FLEXOGRAPHIC PRINTING PLATES

(75) Inventors: Tetsuaki Matsubara, Tokyo (JP); Ryouji Oda, Tokyo (JP)

(73) Assignee: Zeon Corporation, Tokyo (JP)

( * ) Notice: Subject to any disclaimer, the term of this patent is extended or adjusted under 35 U.S.C. 154(b) by 66 days.

(21) Appl. No.: 13/138,493

(22) PCT Filed: Feb. 24, 2010

(86) PCT No.: PCT/JP2010/052879
§ 371 (c)(1),
(2), (4) Date: Aug. 26, 2011

(87) PCT Pub. No.: WO2010/098356
PCT Pub. Date: Sep. 2, 2010

(65) Prior Publication Data
US 2011/0308412 A1    Dec. 22, 2011

(30) Foreign Application Priority Data
Feb. 27, 2009    (JP) .................. 2009-047401

(51) Int. Cl.
*B41N 1/12*    (2006.01)
*C08L 53/02*    (2006.01)

(52) U.S. Cl.
USPC .......... 101/401.1; 101/395; 525/89; 525/271; 430/270.1

(58) Field of Classification Search
None
See application file for complete search history.

(56) References Cited

U.S. PATENT DOCUMENTS

| | | |
|---|---|---|
| 4,104,327 A | 8/1978 | Inoue et al. |
| 4,335,221 A | 6/1982 | Gerberding |
| 4,386,125 A | 5/1983 | Shiraki et al. |
| 4,699,938 A | 10/1987 | Minamizaki et al. |
| 4,939,207 A | 7/1990 | Fasulo et al. |
| 5,290,842 A | 3/1994 | Sasaki et al. |
| 5,723,222 A | 3/1998 | Sato et al. |
| 6,291,583 B1 | 9/2001 | Komatsuzaki et al. |
| 6,329,459 B1 | 12/2001 | Kang et al. |
| 6,344,518 B1 | 2/2002 | Kobayashi et al. |
| 6,531,263 B2 | 3/2003 | Knoll |
| 6,593,430 B1 | 7/2003 | Knoll et al. |
| 7,318,985 B2 | 1/2008 | Tsubaki et al. |
| 2004/0242775 A1 | 12/2004 | Tahara et al. |
| 2005/0009990 A1 | 1/2005 | Knoll et al. |
| 2005/0233249 A1 | 10/2005 | Muldermans et al. |
| 2006/0099373 A1 | 5/2006 | Dupont et al. |
| 2006/0205874 A1 | 9/2006 | Uzee et al. |
| 2006/0205877 A1 | 9/2006 | DuBois |
| 2006/0235165 A1 | 10/2006 | Kawanabe et al. |
| 2008/0318161 A1 | 12/2008 | Nakano et al. |
| 2011/0046307 A1 | 2/2011 | Takeshi et al. |
| 2011/0257337 A1 | 10/2011 | Oda et al. |

FOREIGN PATENT DOCUMENTS

| | | |
|---|---|---|
| CN | 102264854 A | 11/2011 |
| EP | 1 775 332 A1 | 4/2007 |
| EP | 1625178 B1 | 7/2007 |
| GB | 1395822 A | 5/1975 |
| JO | 9-78048 A | 3/1997 |
| JP | 51-125135 A | 11/1976 |
| JP | 56-59230 A | 5/1981 |
| JP | 57-178722 A | 11/1982 |
| JP | 59-187048 A | 10/1984 |
| JP | 61-231070 A | 10/1986 |
| JP | 63-66277 A | 3/1988 |
| JP | 63-179956 A | 7/1988 |
| JP | 64-65152 A | 3/1989 |
| JP | 64-79251 A | 3/1989 |
| JP | 2-222440 A | 9/1990 |
| JP | 5-93176 A | 4/1993 |
| JP | 5-263056 A | 10/1993 |
| JP | 5-287084 A | 11/1993 |
| JP | 8-60121 A | 3/1996 |
| JP | 8-283685 A | 10/1996 |
| JP | 9-66554 A | 3/1997 |
| JP | 11-12430 A | 1/1999 |
| JP | 2000-155418 A | 6/2000 |
| JP | 2001-204129 A | 7/2000 |
| JP | 2001-504519 A | 4/2001 |
| JP | 2001-520244 A | 10/2001 |
| JP | 2002-60583 A | 2/2002 |
| JP | 2002-72457 A | 3/2002 |
| JP | 2002-519465 A | 7/2002 |
| JP | 2003-73434 A | 3/2003 |
| JP | 2003-261740 A | 9/2003 |
| JP | 2004-107519 A | 4/2004 |
| JP | 2004-238548 A | 8/2004 |
| JP | 2004-331707 A | 11/2004 |
| JP | 2005-510612 A | 4/2005 |
| JP | 2005-232246 A | 9/2005 |

(Continued)

OTHER PUBLICATIONS

International Search Report for International Application No. PCT/JP2009/056449, dated Jun. 9, 2009.
International Search Report for International Application No. PCT/JP2009/071684, dated Feb. 2, 2010.
International Search Report for International Application No. PCT/JP2009/071692, dated Feb. 23, 2010.
International Search Report for International Application No. PCT/JP2010/055580, dated Jun. 15, 2010.

(Continued)

*Primary Examiner* — Joshua D Zimmerman
(74) *Attorney, Agent, or Firm* — Birch, Stewart, Kolasch & Birch, LLP

(57) ABSTRACT

Disclosed is a block copolymer composition for flexographic printing plates, which is capable of providing a flexographic printing plate that has much more excellent wear resistance than conventional flexographic printing plates, while maintaining sufficient rubber elasticity. The block copolymer composition for flexographic printing plates comprises a block copolymer A and a block copolymer B, each of which is an aromatic vinyl-conjugated diene-aromatic vinyl block copolymer having a specific structure, wherein a content of the aromatic vinyl monomer unit in the block copolymer A is 41% or more.

7 Claims, No Drawings

(56) References Cited

FOREIGN PATENT DOCUMENTS

| | | |
|---|---|---|
| JP | 2006-89546 A | 4/2006 |
| JP | 2006-514338 A | 4/2006 |
| JP | 2006-241177 A | 9/2006 |
| JP | 2006-520826 A | 9/2006 |
| JP | 2006-274158 A | 10/2006 |
| JP | 2006-282683 A | 10/2006 |
| JP | 2006-528273 A | 12/2006 |
| JP | 2007-230180 A | 9/2007 |
| JP | 2008-7654 A | 1/2008 |
| JP | 2008-533230 A | 8/2008 |
| WO | WO 97/30844 A1 | 8/1997 |
| WO | WO 99/19388 A1 | 4/1999 |
| WO | WO 00/00546 A1 | 1/2000 |
| WO | WO 03/020825 A1 | 3/2003 |
| WO | WO 2004/074392 A1 | 9/2004 |
| WO | WO 2004/076556 A1 | 9/2004 |
| WO | WO 2004/104095 A1 | 12/2004 |
| WO | WO 2005/031459 A1 | 4/2005 |
| WO | WO 2006/051863 A1 | 5/2006 |
| WO | WO 2007/072613 A1 | 6/2007 |
| WO | WO 2009/123089 A1 | 10/2009 |

OTHER PUBLICATIONS

International Search Report for International Application No. PCT/JP2010/055581, dated Jun. 29, 2010.
International Search Report for International Application No. PCT/JP2010/060760, dated Aug. 10, 2010.
US Office Action for U.S. Appl. No. 12/935,361, dated Aug. 31, 2012.
US Office Action for U.S. Appl. No. 13/141,950, dated Sep. 11, 2012.
US Office Action for U.S. Appl. No. 13/142,065, dated Sep. 7, 2012.
US Office Action for U.S. Appl. No. 13/255,354, dated Aug. 31, 2012.
International Search Report, dated Mar. 23, 2010, issued in PCT/JP2010/052879.
Extended European Search Report for Application No. 10746236.8 dated Jun. 22, 2012.
U.S. Office Action dated Apr. 3, 2013 for U.S. Appl. No. 13/255,217.
Notice of Allowance for U.S. Appl. No. 13/255,354, dated Mar. 18, 2013.
Office Action for U.S. Appl. No. 13/141,950, dated Mar. 21, 2013.
European Search Report issued in European Application No. 10758654.7 on Jun. 5, 2013.
Notice of Allowance issued in U.S. Appl. No. 13/142,065 on Apr. 5, 2013.

BLOCK COPOLYMER COMPOSITION FOR FLEXOGRAPHIC PRINTING PLATES

TECHNICAL FIELD

The present invention relates to a block copolymer composition for flexographic printing plates, which comprises a block copolymer composition containing a block copolymer having a conjugated diene polymer block and an aromatic vinyl polymer block. More specifically, it relates to a block copolymer composition for flexographic printing plates, which is capable of providing a flexographic printing plate that has much more excellent wear resistance than conventional flexographic printing plates, while maintaining sufficient rubber elasticity.

BACKGROUND ART

As a method of printing plastic containers, cartons, plastic bags, boxes and envelopes, flexographic printing is widely used. As flexographic printing plates used in this flexographic printing, those formed by exposure, to light, of a composition for photosensitive flexographic printing plates which contains an elastomer, a polymerizable ethylenically unsaturated monomer and a photopolymerization initiator, are frequently used.

The composition for photosensitive flexographic printing plates is usually formed into a sheet and supplied as a multilayer sheet having a flexible sheet as a supporting body arranged on one side and a protective film arranged on the other side. By exposing the multilayer sheet to light at the side of the supporting body, the layer of the composition for photosensitive flexographic printing plates is cured to specific thickness. Then, the protective film is removed and a negative film is closely applied to the surface of the composition layer, and the negative film is irradiated with light. The part of the composition for photosensitive flexographic printing plates that is penetrated with light is cured, and an uncured part is removed by an organic solvent or an aqueous solvent, whereby a flexographic printing plate having a concave-convex structure is formed.

As for the elastomer used for producing a composition for photosensitive flexographic printing plates, a thermoplastic elastomer having excellent processability is widely used. In particular, as having sufficient rubber elasticity and flexibility and rebound resilience that are suitable for producing a flexographic printing plate, an aromatic vinyl-conjugated diene-aromatic vinyl block copolymer such as styrene-isoprene-styrene block copolymer (SIS) and styrene-butadiene-styrene block copolymer (SBS) is commonly used as an elastomer for producing a composition for photosensitive flexographic printing plates. In this connection, various studies have been made on the improvement of an aromatic vinyl-conjugated diene-aromatic vinyl block copolymer used for producing a composition for photosensitive flexographic printing plates.

In Patent Literature 1, for example, it is disclosed that a photocurable polymer composition, which is used for producing a flexographic printing plate, is obtained by using a mixture of SIS and a styrene-isoprene block copolymer (i.e., diblock). It is described that the photocurable polymer composition has excellent balance of various the physical properties that are required for a flexographic printing plate, such as flexibility for wrapping a printing cylinder and wear resistance for enduring repeated printing, etc.

Further, in Patent Literature 2, it is disclosed that a photocurable polymer composition for producing a flexographic printing plate is obtained by using a mixture of SIS and SBS. It is described that the photocurable polymer composition has high wear resistance and excellent flexibility without having excessive hardness. It is also described that the photocurable polymer composition does not exhibit anisotropy that is caused by molecular orientation occurring during melt-molding and thus it can avoid a bad influence on printing which may occur when a flexographic printing plate prepared with a material having anisotropy is used.

Further, in Patent Literature 3, it is disclosed that a block copolymer composition for flexographic printing plates is produced by using a composition containing a three-branched aromatic vinyl-conjugated diene block copolymer that is obtained by using a specific coupling agent. It is described that the block copolymer composition for flexographic printing plates shows excellent surface smoothness and excellent antiflowing properties (i.e., properties that are resistant to any deformation before curing by photosensitization) when a flexographic printing plate is prepared therewith.

However, even when the compositions described in Patent Literatures 1 to 3 are used, it remains difficult to obtain a flexographic printing plate having sufficient wear resistance while maintaining the rubber elasticity that is expected for the aromatic vinyl-conjugated diene-aromatic vinyl block copolymer. Specific reasons are as follows. It is known that mechanical strength and properties such as wear resistance of an aromatic vinyl-conjugated diene-aromatic vinyl block copolymer are improved by increasing the content ratio of an aromatic vinyl monomer unit included therein. However, there is a problem that, when the content ratio of an aromatic vinyl monomer unit is increased to the level at which wear resistance sufficient for use as a flexographic printing plate is obtained, the polymer becomes to lose rubber elasticity.

CITATION LIST

Patent Literature

Patent Literature 1: Japanese Patent Application National Publication No. 2002-519465
Patent Literature 2: Japanese Patent Application Laid-Open No. 2002-072457
Patent Literature 3: WO 2005/031459

SUMMARY OF INVENTION

Technical Problem

An object of the invention is to provide a block copolymer composition for flexographic printing plates, which is capable of providing a flexographic printing plate that has much more excellent wear resistance than conventional flexographic printing plates, while maintaining sufficient rubber elasticity.

Solution to Problem

The inventors of the invention extensively studied to achieve the object described above. As a result, it was found that a block copolymer composition comprising two kinds of block copolymers with a conjugated diene polymer block and an aromatic vinyl polymer block, each of which has a specific constitution, can maintain sufficient rubber elasticity even when the content ratio of the aromatic vinyl monomer unit is increased to the point where rubber elasticity disappears in a conventional aromatic vinyl-conjugated diene-aromatic vinyl block copolymer. It was also found that a flexographic printing plate that has much more excellent wear resistance than conventional flexographic printing plates, while maintaining sufficient rubber elasticity, can be obtained by using the composition as a material for producing a flexographic printing plate, and thus the invention is completed based on these findings.

Thus, according to the invention, there is provided a block copolymer composition for flexographic printing plates, comprising a block copolymer A represented by the following Formula (A) and a block copolymer B represented by the following Formula (B), wherein a content of an aromatic vinyl monomer unit in the block copolymer A is 41% or more:

$$Ar1^a\text{-}D^a\text{-}Ar2^a \quad (A)$$

$$(Ar^b\text{-}D^b)_n\text{-}X \quad (B)$$

(in the Formulae (A) and (B), $Ar1^a$ and $Ar^b$ each are an aromatic vinyl polymer block with a weight average molecular weight of 6000 to 20000, $Ar2^a$ is an aromatic vinyl polymer block with a weight average molecular weight of 40000 to 400000, $D^a$ and $D^b$ each are a conjugated diene polymer block with a vinyl bond content of 1 to 20 mol %, X is a single bond or a residue of a coupling agent, and n is an integer of 2 or more).

In the block copolymer composition for flexographic printing plates, a ratio of an aromatic vinyl monomer unit relative to entire monomer units constituting a polymer component of the block copolymer composition for flexographic printing plates is preferably 20 to 70% by weight.

In the block copolymer composition for flexographic printing plates, a weight ratio (A/B) between the block copolymer A and the block copolymer B is preferably from 36/64 to 85/15.

The block copolymer composition for flexographic printing plates preferably comprises a block copolymer C represented by the following Formula (C):

$$Ar^c\text{-}D^c \quad (C)$$

(in the Formula (C), $Ar^c$ is an aromatic vinyl polymer block with a weight average molecular weight of 6000 to 20000 and $D^c$ is a conjugated diene polymer block with a vinyl bond content of 1 to 20 mol %).

In the block copolymer composition for flexographic printing plates, the block copolymer B is preferably obtained by using, as a coupling agent, a compound having two or more functional groups in one molecule and the functional group is at least one selected from an alkoxyl group, an ester group, and an epoxy group.

Further, according to the invention, there is provided a composition for photosensitive flexographic printing plates, comprising the block copolymer composition for flexographic printing plates, an ethylenically unsaturated compound with a molecular weight of 5000 or less, and a photopolymerization initiator.

Further, according to the invention, there is provided a flexographic printing plate obtained by using the composition for photosensitive flexographic printing plates.

Advantageous Effects of Invention

According to the invention, a block copolymer composition for flexographic printing plates which is capable of providing a flexographic printing plate that has much more excellent wear resistance than conventional flexographic printing plates, while maintaining sufficient rubber elasticity, can be provided.

DESCRIPTION OF EMBODIMENTS

The block copolymer composition for flexographic printing plates contains at least two kinds of block copolymers. A block copolymer A, which is one of the two kinds of block copolymers constituting the block copolymer composition for flexographic printing plates of the invention, is an aromatic vinyl-conjugated diene-aromatic vinyl block copolymer which has two aromatic vinyl polymer blocks represented by the following Formula (A) with different weight average molecular weights.

$$Ar1^a\text{-}D^a\text{-}Ar2^a \quad (A)$$

In Formula (A), $Ar1^a$ represents an aromatic vinyl polymer block having a weight average molecular weight of 6000 to 20000, $Ar2^a$ represents an aromatic vinyl polymer block having a weight average molecular weight of 40000 to 400000, and $D^a$ represents a conjugated diene polymer block having a vinyl bond content of 1 to 20 mol %.

Further, a block copolymer B, which is the other of the two kinds of block copolymers constituting the block copolymer composition for flexographic printing plates of the invention, is an aromatic vinyl-conjugated diene-aromatic vinyl block copolymer represented by the following Formula (B).

$$(Ar^b\text{-}D^b)_n\text{-}X \quad (B)$$

In Formula (B), $Ar^b$ represents an aromatic vinyl polymer block having a weight average molecular weight of 6000 to 20000, $D^b$ represents a conjugated diene polymer block having a vinyl bond content of 1 to 20 mol %, X represents a single bond or a residue of a coupling agent, and n represents an integer of 2 or more.

The block copolymer composition for flexographic printing plates of the invention may contain, in addition to the block copolymer A and the block copolymer B, a block copolymer C represented by the following Formula (C), which is an aromatic vinyl-conjugated diene block copolymer.

$$Ar^c\text{-}D^c \quad (C)$$

In Formula (C), $Ar^c$ represents an aromatic vinyl polymer block having a weight average molecular weight of 6000 to 20000, and $D^c$ represents a conjugated diene polymer block having a vinyl bond content of 1 to 20 mol %.

Each aromatic vinyl polymer block ($Ar1^a$, $Ar2^a$, $Ar^b$ and $Ar^c$) contained in the block copolymers A to C is a polymer block which is constituted with an aromatic vinyl monomer unit. Examples of the aromatic vinyl monomer that is used for constituting the aromatic vinyl monomer unit of the aromatic vinyl polymer block include, although not specifically limited as long as the aromatic vinyl monomer is an aromatic vinyl compound, styrene, α-methylstyrene, 2-methylstyrene, 3-methylstyrene, 4-methylstyrene, 2-ethylstyrene, 3-ethylstyrene, 4-ethylstyrene, 2,4-diisopropylstyrene, 2,4-dimethylstyrene, 4-t-butylstyrene, 5-t-butyl-2-methylstyrene, 2-chlorostyrene, 3-chlorostyrene, 4-chlorostyrene, 4-bromostyrene, 2-methyl-4,6-dichlorostyrene, 2,4-dibromostyrene, and vinyl naphthalene. Of these, styrene is preferably used. The aromatic vinyl monomer may be used either singly or in combination of two or more in each aromatic vinyl polymer block. Further, in each aromatic vinyl polymer block, either the same aromatic vinyl monomer or different aromatic vinyl monomers may be used.

Each aromatic vinyl polymer block ($Ar1^a$, $Ar2^a$, $Ar^b$ and $Ar^c$) of the block copolymers A to C may contain a monomer unit other than the aromatic vinyl monomer unit. Examples of the monomer which constitutes the monomer unit other than the aromatic vinyl monomer unit that may be contained in each aromatic vinyl polymer block include a conjugated diene monomer such as 1,3-butadiene and isoprene (2-methyl-1,3-butadiene), an α,β-unsaturated nitrile monomer, an unsaturated carboxylic acid or acid anhydride monomer, an unsaturated carboxylic acid ester monomer, and a non-conjugated diene monomer. The content of the monomer unit other than the aromatic vinyl monomer unit in each aromatic vinyl polymer block is preferably 20% by weight or less, and more preferably 10% by weight or less. Particularly preferably, it is substantially 0% by weight.

Each conjugated diene polymer block ($D^a$, $D^b$ and $D^c$) of the block copolymers A to C is a polymer block which is constituted with a conjugated diene monomer unit. The conjugated diene used for constituting the conjugated diene monomer unit of each conjugated diene polymer block is not specifically limited, as long as it is a conjugated diene compound. Examples thereof include 1,3-butadiene, isoprene, 2,3-dimethyl-1,3-butadiene, 2-chloro-1,3-butadiene, 1,3-pentadiene, and 1,3-hexadiene. Of these, 1,3-butadiene and/or isoprene are preferably used. Isoprene is particularly preferably used. By constituting the conjugated diene polymer blocks with an isoprene unit, the block copolymer composition for flexographic printing plates obtained can have sufficient flexibility, and therefore a flexographic printing plate having excellent flexibility can be provided. The conjugated diene monomer may be used either singly or in combination of two or more in each conjugated diene polymer block. Further, in each conjugated diene polymer block, either the same conjugated diene monomer or different conjugated diene monomers may be used. Still further, hydrogenation reaction may be performed on part of the unsaturated bond of each conjugated diene polymer block.

Each conjugated diene polymer block ($D^a$, $D^b$ and $D^c$) of the block copolymers A to C may contain a monomer unit other than the conjugated diene monomer unit. Examples of monomers which constitute the monomer unit other than the conjugated diene monomer unit that may be contained in the conjugated diene polymer blocks include an aromatic vinyl monomer such as styrene and α-methylstyrene, an α,β-unsaturated nitrile monomer, an unsaturated carboxylic acid or acid anhydride monomer, an unsaturated carboxylic acid ester monomer, and a non-conjugated diene monomer. The content of the monomer unit other than the conjugated diene monomer unit in each conjugated diene polymer block is preferably 20% by weight or less, and more preferably 10% by weight or less. Particularly preferably, it is substantially 0% by weight.

The block copolymer A which constitutes the block copolymer composition for flexographic printing plates is, as represented by Formula (A) above, a non-symmetric aromatic vinyl-conjugated diene-aromatic vinyl block copolymer that is formed with the aromatic vinyl polymer block ($Ar1^a$) having a relatively low weight average molecular weight, the conjugated diene polymer block ($D^a$) having a specific vinyl bond content, and the aromatic vinyl polymer block ($Ar2^a$) having a relatively high weight average molecular weight, wherein the blocks are arranged sequentially in this order. The weight average molecular weight ($Mw(Ar1^a)$) of the aromatic vinyl polymer block ($Ar1^a$) having a relatively low weight average molecular weight is 6000 to 20000, preferably 7000 to 18000, and more preferably 8000 to 16000. When $Mw(Ar1^a)$ is not within this range, the rubber elasticity of the block copolymer composition for flexographic printing plates obtained might be insufficient. Further, the weight average molecular weight ($Mw(Ar2^a)$) of the aromatic vinyl polymer block ($Ar2^a$) having a relatively high weight average molecular weight is 40000 to 400000, preferably 42000 to 370000, and more preferably 45000 to 350000. If the $Mw(Ar2^a)$ is too low, the block copolymer composition for flexographic printing plates obtained may have poor wear resistance, and may easily exhibit undesirable anisotropy. On the other hand, the block copolymer A with excessive $Mw(Ar2^a)$ may not be easily produced.

According to the invention, the weight average molecular weight of the polymer or polymer block is required to be a value that is obtained in terms of polystyrene based on a high speed liquid chromatography measurement.

Regarding the block copolymer A, the ratio between the weight average molecular weight ($Mw(Ar2^a)$) of the aromatic vinyl polymer block ($Ar2^a$) having a relatively high weight average molecular weight and the weight average molecular weight ($Mw(Ar1^a)$) of the aromatic vinyl polymer block ($Ar1^a$) having a relatively low weight average molecular weight, i.e., ($Mw(Ar2^a)/Mw(Ar1^a)$), is not specifically limited, but in general from 2 to 67, preferably from 4 to 40, and more preferably from 4.5 to 35. By having the block copolymer A with the constitution above, the block copolymer composition for flexographic printing plates obtained can maintain rubber elasticity even when the content of the aromatic vinyl monomer unit is set high to prepare excellent wear resistance.

The vinyl bond content in the conjugated diene polymer block ($D^a$) of the block copolymer A (i.e., the ratio of 1,2-vinyl bond and 3,4-vinyl bond in the entire conjugated diene monomer unit) is 1 to 20 mol %, preferably 2 to 15 mol %, and more preferably 3 to 10 mol %. If the vinyl bond content is too large, the block copolymer composition for flexographic printing plates obtained becomes too hard, and thus it may have poor flexibility.

The weight average molecular weight ($Mw(D^a)$) of the conjugated diene polymer block ($D^a$) of the block copolymer A is not specifically limited, but in general it is 40000 to 200000, preferably 42000 to 180000, and more preferably 45000 to 150000. With the $Mw(D^a)$ within this range, the block copolymer composition for flexographic printing plates obtained can easily maintain rubber elasticity even when the content of the aromatic vinyl monomer unit is set high to prepare excellent wear resistance.

It is necessary that the content of the aromatic vinyl monomer unit relative to the entire monomer units in the block copolymer A is at least 41% or more. Preferably, it is 43 to 87% by weight, and more preferably 45 to 85% by weight. By having the content of the aromatic vinyl monomer unit relative to the entire monomer units in the block copolymer A within this range, the block copolymer composition for flexographic printing plates obtained can have excellent wear resistance.

The weight average molecular weight of the block copolymer A as a whole is not specifically limited. It is generally 90000 to 500000, preferably 100000 to 450000, and more preferably 110000 to 400000.

The block copolymer B which constitutes the block copolymer composition for flexographic printing plates of the invention is, as represented by Formula (B) above, a block copolymer wherein two or more of diblocks ($Ar^b$-$D^b$) each of which is formed with the aromatic vinyl polymer block ($Ar^b$) having a specific weight average molecular weight and the conjugated diene polymer block ($D^b$) with a specific vinyl bond content are bonded directly to one another or via a residue of a coupling agent. The weight average molecular weight ($Mw(Ar^b)$) of the aromatic vinyl polymer block ($Ar^b$) which constitutes the block copolymer B is 6000 to 20000, preferably 7000 to 18000, and more preferably 8000 to 16000. When $Mw(Ar^b)$ is too low, the wear resistance of the block copolymer composition for flexographic printing plates obtained might be impaired. On the other hand, if it is too high, the flexibility or rubber elasticity might be impaired. A plurality of the aromatic vinyl polymer blocks contained in the block copolymer B may have either the same or different weight average molecular weights (Mw($Ar^b$)) from each other if they are within the range above. Preferably, they are substantially the same. Further, the weight average molecular weights (Mw($Ar^b$)) of these aromatic vinyl polymer blocks are substantially the same as the weight average molecular weight (Mw($Ar1^a$)) of the aromatic vinyl polymer block ($Ar1^a$) having a relatively low weight average molecular weight in the block copolymer A.

The vinyl bond content in the conjugated diene polymer block ($D^b$) of the block copolymer B is 1 to 20 mol %, preferably 2 to 15 mol %, and more preferably 3 to 10 mol %. If the vinyl bond content is too large, the block copolymer composition for flexographic printing plates obtained becomes too hard, and thus it may have poor flexibility. Further, it is preferable that the vinyl bond content in the conjugated diene polymer block ($D^b$) of the block copolymer B is substantially the same as the vinyl bond content in the conjugated diene polymer block ($D^a$) of the block copolymer A.

The block copolymer B is constituted with a diblock ($Ar^b$-$D^b$) which is formed with the aromatic vinyl polymer block ($Ar^b$) and the conjugated diene polymer block ($D^b$), wherein the diblocks are bonded directly to one another or via a residue of a coupling agent. A coupling agent which constitutes the residue of the coupling agent can be any bi- or higher-functional coupling agent, and it is not specifically limited. Examples of the bifunctional coupling agent include bifunctional halogenated silanes such as dichlorosilane, monomethyldichlorosilane, and dimethyldichlorosilane; bifunctional alkoxysilanes such as diphenyldimethoxysilane and diphenyldiethoxysilane; bifunctional halogenated alkanes such as dichloroethane, dibromoethane, methylene chloride, and dibromomethane; bifunctional halogenated tin compounds such as dichlorotin, monomethyldichlorotin, dimethyldichlorotin, monoethyldichlorotin, diethyldichlorotin, monobutyldichlorotin, and dibutyldichlorotin; dibromobenzene, benzoic acid, carbon monoxide and 2-chloropropene. Examples of the trifunctional coupling agent include trifunctional halogenated alkanes such as trichloroethane and trichloropropane; trifunctional halogenated silanes such as methyltrichlorosilane and ethyltrichlorosilane; trifunctional alkoxysilanes such as methyltrimethoxysilane, phenyltrimethoxysilane, and phenyltriethoxysilane. Examples of the tetrafunctional coupling agent include tetrafunctional halogenated alkanes such as carbon tetrachloride, carbon tetrabromide, and tetrachloroethane; tetrafunctional halogenated silanes such as tetrachlorosilane and tetrabromosilane; tetrafunctional alkoxysilanes such as tetramethoxysilane and tetraethoxysilane; tetrafunctional halogenated tin compounds such as tetrachlorotin and tetrabromotin. Examples of the penta- or higher-functional coupling agent include 1,1,1,2,2-pentachloroethane, perchloroethane, pentachlorobenzene, perchlorobenzene, octabromodiphenyl ether, and decabromodiphenyl ether. The coupling agent may be used either singly or in combination of two or more.

Among the coupling agents described above, for obtaining the block copolymer B, it is preferable to use a compound having at least two functional groups in one molecule as a functional group that can react with an active terminal of the polymer, and is at least one selected from an alkoxyl group, an ester group, and an epoxy group. It is particularly preferable to use an alkoxysilane compound having at least two alkoxy groups in one molecule in which the alkoxy group is directly bonded to a silicon atom. Specifically, the block copolymer B which constitutes the block copolymer composition for flexographic printing plates of the invention is preferably obtained by using, as a coupling agent, a compound having at least two functional groups in one molecule and the functional group is at least one selected from an alkoxyl group, an ester group, and an epoxy group. Particularly preferably, it is obtained by using, as a coupling agent, an alkoxysilane compound having at least two alkoxy groups in one molecule and the alkoxy group is directly bonded to a silicon atom. By using the coupling agent, a block copolymer composition for flexographic printing plates having excellent transparency can be obtained, and also a flexographic printing plate having fine printing pattern can be easily produced from the composition for photosensitive flexographic printing plates obtained.

In the block copolymer B, the number of the diblocks ($Ar^b$-$D^b$) bonded therein (i.e., n in Formula (B)) is not specifically limited if it is 2 or more. A mixture of the block copolymers B having different numbers of bonded diblocks can be also used. The n in Formula (B) is not specifically limited if it is an integer of 2 or more. In general, it is an integer of from 2 to 8 and preferably an integer of from 2 to 4. Further, it is particularly preferable that, as at least a part of the block copolymer B, three or more diblocks ($Ar^b$-$D^b$) are bonded via a coupling agent (i.e., n in Formula (B) is 3 or more). That is because, although the block copolymer composition for flexographic printing plates of the invention can give a flexographic printing plate having high isotropy with homogenous mechanical properties in all directions even when a molding method that can easily cause molecular orientation such as extrusion molding during production of flexographic printing plate is used, by having three or more diblocks ($Ar^b$-$D^b$) that are bonded via a coupling agent as at least a part of the block copolymer B, a flexographic printing plate which has especially high isotropy and is not likely to cause any bad printing can be provided.

The weight average molecular weight (Mw($D^b$)) of the conjugated diene polymer block ($D^b$) of the block copolymer B is not specifically limited, but in general it is 40000 to 200000, preferably 42000 to 180000, and more preferably 45000 to 150000. With the Mw($D^b$) within this range, the block copolymer composition for flexographic printing plates obtained can easily maintain rubber elasticity even when the content of the aromatic vinyl monomer unit is set high to prepare excellent wear resistance. Further, it is preferable that the weight average molecular weight (Mw($D^b$)) of the conjugated diene polymer block ($D^b$) of the block copolymer B is substantially the same as the weight average molecular weight (Mw($D^a$)) of the conjugated diene polymer block ($D^a$) of the block copolymer A. When an aromatic vinyl-conjugated diene-aromatic vinyl block copolymer that is produced without using a coupling agent is used as the block copolymer B, all monomer units in the conjugated diene polymer block which is included in the copolymer are directly bonded to one another so that it cannot be said that it is substantially formed with two conjugated diene polymer blocks ($D^b$). However, such a conjugated diene polymer block is treated as a copolymer in which two conjugated diene polymer blocks ($D^b$) conceptually having substantially the same weight average molecular weight are directly bonded to one another via a single bond. Thus, with respect to the block copolymer B which is an aromatic vinyl-conjugated diene-aromatic vinyl block copolymer produced without using a coupling agent, when the weight average molecular weight of the conjugated diene polymer block as a whole is 100000, it is regarded and treated as if it has the Mw($D^b$) of 50000.

The content of the aromatic vinyl monomer unit relative to the entire monomer units in the block copolymer B is not specifically limited, but it is generally 10 to 35% by weight, preferably 12 to 32% by weight, and more preferably 15 to 30% by weight. The weight average molecular weight of the block copolymer B as a whole is also not specifically limited, but it is generally 52000 to 800000, preferably 70000 to 600000, and more preferably 100000 to 400000.

The block copolymer C which may be included in the block copolymer composition for flexographic printing plates of the invention is, as represented by Formula (C) above, a block copolymer which is formed with the aromatic vinyl polymer block ($Ar^c$) having a specific weight average molecular weight and the conjugated diene polymer block ($D^c$) with a specific vinyl bond content. By including the block copolymer C, the block copolymer composition for flexographic printing plates can have excellent balance between wear resistance and rubber elasticity. The weight average molecular weight (Mw($Ar^c$)) of the aromatic vinyl polymer block ($Ar^c$) which constitutes the block copolymer C is 6000 to 20000, preferably 7000 to 18000, and more preferably 8000 to 16000. Further, the weight average molecular weight (Mw($Ar^c$)) of aromatic vinyl polymer block ($Ar^c$) of the block copolymer C is preferably the same substantially as at least one of the weight average molecular weight (Mw($Ar1^a$)) of the aromatic vinyl polymer block ($Ar1^a$) having a relatively low weight average molecular weight in the block copolymer A and the weight average molecular weight (Mw($Ar^b$)) of the aromatic vinyl polymer block ($Ar^b$) in the block copolymer B. More preferably, it is substantially the same as both molecular weights.

The vinyl bond content in the conjugated diene polymer block ($D^c$) of the block copolymer C is 1 to 20 mol %, preferably 2 to 15 mol %, and more preferably 3 to 10 mol %. Further, the vinyl bond content in the conjugated diene polymer block ($D^c$) of the block copolymer C is substantially the same as at least one of the vinyl bond contents of the conjugated diene polymer block ($D^a$) in the block copolymer A and the conjugated diene polymer block ($D^b$) in the block copolymer B. More preferably, it is substantially the same as both vinyl bond contents.

The weight average molecular weight (Mw($D^c$)) of the conjugated diene polymer block ($D^c$) in the block copolymer C is not specifically limited, but in general it is 40000 to 200000, preferably 42000 to 180000, and more preferably 45000 to 150000. With the Mw($D^c$) within this range, the block copolymer composition for flexographic printing plates obtained can have excellent rubber elasticity. Further, the weight average molecular weight (Mw($D^c$)) of the conjugated diene polymer block ($D^c$) in the block copolymer C is substantially the same as at least one of the weight average molecular weight (Mw($D^a$)) of the conjugated diene polymer block ($D^a$) in the block copolymer A and the weight average molecular weight (Mw($D^b$)) of the conjugated diene polymer block ($D^b$) in the block copolymer B. More preferably, it is substantially the same as both molecular weights.

The content of the aromatic vinyl monomer unit relative to the entire monomer units in the block copolymer C is not specifically limited, but it is generally 10 to 35% by weight, preferably 12 to 32% by weight, and more preferably 15 to 30% by weight. It is preferable that the content of the aromatic vinyl monomer unit relative to the entire monomer units in the block copolymer C is substantially the same as the content of the aromatic vinyl monomer unit relative to the entire monomer units in the block copolymer B. The weight average molecular weight of the block copolymer B as a whole is not specifically limited, but it is generally 46000 to 200000, preferably 50000 to 180000, and more preferably 55000 to 160000.

The molecular weight distribution represented by, the ratio (Mw/Mn) between the weight average molecular weight (Mw) and the number average molecular weight (Mn) of each polymer block constituting the block copolymers A to C, is not specifically limited. However, it is generally 1.1 or less, and preferably 1.05 or less.

The weight ratio (A/B) between the polymer block A and the polymer block B included in the block copolymer composition for flexographic printing plates of the invention is not specifically limited, but it is preferably 36/64 to 85/15, preferably 38/62 to 80/20, and more preferably 40/60 to 75/25. By having the block copolymer A and the block copolymer B with the ratio above, the block copolymer composition for flexographic printing plates obtained can have excellent wear resistance while maintaining sufficient rubber elasticity.

The amount of the block copolymer C which may be included in the block copolymer composition for flexographic printing plates of the invention is not specifically limited. However, in terms of the weight ratio relative to the total weight of the block copolymer A and the block copolymer B (i.e., C/(A+B)), it is preferably from 0/100 to 50/50, more preferably from 5/95 to 40/60, and particularly preferably from 10/90 to 30/70. By having the block copolymer C with this ratio, the block copolymer composition for flexographic printing plates obtained can have excellent balance between wear resistance and rubber elasticity.

The block copolymer composition for flexographic printing plates of the invention may contain only the block copolymers A to C as a polymer component. However, it may also contain a polymer component other than the block copolymers A to C. Examples of the polymer component other than the block copolymers A to C which may be contained in the block copolymer composition for flexographic printing plates of the invention include an aromatic vinyl-conjugated diene-aromatic vinyl block copolymer other than the block copolymer A and the block copolymer B, an aromatic vinyl-conjugated diene block copolymer other than the block copolymer C, an aromatic vinyl homopolymer, a conjugated diene homopolymer, an aromatic vinyl-conjugated diene random copolymer, and branched-type polymers thereof, thermoplastic elastomers such as a polyurethane-based thermoplastic elastomer, a polyamide-based thermoplastic elastomer, and a polyester-based thermoplastic elastomer, and thermoplastic resins such as polyethylene, polypropylene, polyvinyl chloride, an acrylonitrile-styrene copolymer, an acrylonitrile-butadiene-styrene copolymer and polyphenylene ether. In the block copolymer composition for flexographic printing plates of the invention, the content of the polymer component other than the block copolymers A to C is, relative to the entire polymer components, preferably 20% by weight or less, and more preferably 10% by weight or less.

The ratio of the aromatic vinyl monomer unit in the block copolymer composition for flexographic printing plates of the invention is (it may be also referred as the content of the entire aromatic vinyl monomer unit herein below), relative to the entire monomer units containing the polymer component, 20 to 70% by weight, preferably 22 to 60% by weight, and more preferably 25 to 50% by weight. When the content of the entire aromatic vinyl monomer unit is too small, wear resistance of the block copolymer composition for flexographic printing plates may be impaired. On the other hand, when the content of the entire aromatic vinyl monomer unit is too large, the block copolymer composition for flexographic printing plates may not have the rubber elasticity that is required for a flexographic printing plate. The content of the entire aromatic vinyl monomer unit can be easily adjusted by modifying the mixing amount of the block copolymers A to C and the polymer component other than them which constitute the block copolymer composition for flexographic printing plates while considering the contents of the aromatic vinyl monomer units in each polymer. Further, when all polymer components constituting the block copolymer composition for flexographic printing plates are composed only of the aromatic vinyl monomer units and the conjugated diene monomer units, according to a method described in Rubber Chem. Technol., 45, 1295 (1972), only the aromatic vinyl monomer unit portion can be extracted by ozonolysis of the polymer component of the block copolymer composition for flexographic printing plates and subsequent reduction using lithium aluminum hydride to dissociate the conjugated diene monomer unit residue, and as a result, it becomes possible to easily measure the content of the entire aromatic vinyl monomer units.

The weight average molecular weight of the entire polymer components which constitute the block copolymer composition for flexographic printing plates of the invention is not specifically limited, but it is generally 50000 to 500000, preferably 60000 to 450000, and more preferably 70000 to 400000. Further, the molecular weight distribution represented by the ratio (Mw/Mn) between the weight average molecular weight (Mw) and the number average molecular weight (Mn) of the entire polymer components constituting the block copolymer composition for flexographic printing plates of the invention, is not specifically limited. However, it is generally 1.01 to 10, preferably 1.03 to 5, and more preferably 1.05 to 3.

The method of producing the block copolymer composition for flexographic printing plates of the invention is not specifically limited. For example, the block copolymer A and the block copolymer B are separately produced according to the conventional method for producing a block copolymer, and if necessary, the block copolymer C or other polymer component is added and mixed with them according to a known method such as kneading or solution mixing to produce the block copolymer composition. However, from the viewpoint of obtaining the block copolymer composition with particularly preferable constitution with higher productivity, a production method described below is preferable.

Specifically, the block copolymer composition for flexographic printing plates of the invention is preferably produced according to the production method having the following processes (1) to (5).

(1): A process in which an aromatic vinyl monomer is polymerized in a solvent using a polymerization initiator (2): A process in which a conjugated diene monomer is added to the solution containing the aromatic vinyl polymer having an active terminal obtained from the above process (1)

(3): A process in which a coupling agent is added, in an amount of less than 1 molar equivalent of a functional group relative to the active terminal, to the solution containing the aromatic vinyl-conjugated diene block copolymer having an active terminal obtained from the above process (2) to form a block copolymer B (4): A process in which an aromatic vinyl monomer is added to the solution obtained from the above process (3) to form a block copolymer A (5): A process in which a block copolymer composition for flexographic printing plates is recovered from the solution obtained from the above process (4)

According to the method for producing the block copolymer composition for flexographic printing plates, the aromatic vinyl monomer is polymerized first in a solvent by using a polymerization initiator. Examples of the polymerization initiator used include organic alkali metal compounds, organic alkali earth metal compounds, and organic lanthanoid series rare earth metal compounds that are generally known to have an anion polymerization activity for an aromatic vinyl monomer and a conjugated diene monomer. As an organic alkali metal compound, an organolithium compound having at least one lithium atom in the molecule is particularly preferably used. Examples thereof include an organo monolithium compound such as ethyllithium, n-propyllithium, isopropyllithium, n-butyllithium, sec-butyllithium, t-butyllithium, hexyllithium, phenyllithium, stilbenelithium, dialkylaminolithium, diphenylaminolithium, and ditrimethylsilylaminolithium, an organodilithium compound such as methylenedilithium, tetramethylenedilithium, hexamethylenedilithium, isoprenyldilithium, and 1,4-dilithio-ethylcyclohexane, and an organotrilithium compound such as 1,3,5-trilithiobenzene. Of these, an organo monolithium compound is particularly preferably used.

Examples of the organic alkali earth metal compound used as a polymerization initiator include n-butylmagnesium bromide, n-hexylmagnesium bromide, ethoxycalcium, calcium stearate, t-butoxystrontium, ethoxybarium, isopropoxybarium, ethylmercaptobarium, t-butoxybarium, phenoxybarium, diethylaminobarium, barium stearate, and ethylbarium. Specific examples of other polymerization initiators include a composite catalyst of lanthanoid series rare earth metal compound including neodymium, samarium, and gadolinium/alkyl aluminum/alkyl aluminum halide/alkyl aluminum hydride, and a metallocene catalyst containing titanium, vanadium, samarium, or gadolinium which can form a homogeneous system in an organic solvent to have a living polymerization property. The polymerization initiator may be used either singly or in combination of two or more.

The use amount of the polymerization initiator is determined depending on the target molecular weight of each block copolymer, and is not specifically limited. However, it is generally 0.01 to 20 millimoles, preferably 0.05 to 15 millimoles, and more preferably 0.1 to 10 millimoles compared to 100 g of the entire monomers used.

The solvent used for the polymerization is not specifically limited if it is inert to the polymerization initiator. Examples thereof include a linear hydrocarbon solvent, a cyclic hydrocarbon solvent, and a mixture solvent thereof. Examples of the linear hydrocarbon solvent include a linear alkane and alkene having 4 to 6 carbon atoms such as n-butane, isobutane, 1-butene, isobutylene, trans-2-butene, cis-2-butene, 1-pentene, trans-2-pentene, cis-2-pentene, n-pentane, isopentane, neo-pentane, and n-hexane. Examples of the cyclic hydrocarbon solvent include an aromatic compound such as benzene, toluene and xylene; and an alicyclic hydrocarbon compound such as cyclopentane and cyclohexane. The solvent may be used either singly or in combination of two or more.

The amount of the solvent used for polymerization is not specifically limited. However, it is decided so that the concentration of the entire block copolymer in a solution after the polymerization is 5 to 60% by weight, preferably 10 to 55% by weight, and more preferably 20 to 50% by weight.

In order to control the structure of each polymer block in each block copolymer for obtaining the block copolymer composition for flexographic printing plates, a Lewis base compound may be added to a reactor used for the polymerization. Examples of the Lewis base compound include ethers such as tetrahydrofuran, diethyl ether, dioxane, ethylene glycol dimethyl ether, ethylene glycol dibutyl ether, diethylene glycol dimethyl ether, and diethylene glycol dibutyl ether; tertiary amines such as tetramethylethylenediamine, trimethylamine, triethylamine, pyridine, and quinuclidine; alkali metal alkoxides such as potassium t-amyloxide and potassium t-butyloxide; and phosphines such as triphenylphosphine. The Lewis base compound may be used either singly or in combination of two or more, and it is appropriately selected within the range that the purpose of the invention is preserved.

The timing for adding the Lewis base compound during the polymerization reaction is not specifically limited, and it is appropriately determined depending on the structure of each target block copolymer. For example, it may be added in advance before starting the polymerization, after polymerization of part of polymer block, or may be added in advance before starting the polymerization followed by further addition after polymerization of part of polymer block.

The polymerization temperature is generally 10 to 150° C., preferably 30 to 130° C., and more preferably 40 to 90° C. The time required for polymerization varies depending on condition, but it is generally within 48 hours, and preferably 0.5 to 10 hours. Regarding the polymerization pressure, the polymerization can be carried out within the pressure range that is sufficient for maintaining the monomer and the solvent at liquid phase in the polymerization temperature range above, and it is not specifically limited.

By polymerizing an aromatic vinyl monomer using a polymerization initiator in a solvent under the condition above, a solution containing an aromatic vinyl polymer having an active terminal can be obtained. The aromatic vinyl polymer having an active terminal is used for constituting the aromatic vinyl polymer block ($Ar1^a$) having a relatively low weight average molecular weight in the block copolymer A and the vinyl polymer block ($Ar^b$) in the block copolymer B, both constituting the block copolymer composition. Thus, the amount of the aromatic vinyl monomer used is determined depending on the target weight average molecular weight of each polymer block.

According to the next process, a conjugated diene monomer is added to a solution containing the aromatic vinyl polymer having an active terminal as obtained above. As a result of the addition of the conjugated diene monomer, a conjugated diene polymer chain is formed from the active terminal to give a solution containing an aromatic vinyl-conjugated diene block copolymer (i.e., diblock) having an active terminal. The amount of the conjugated diene monomer used is determined so that the conjugated diene polymer chain obtained can have the target weight average molecular weight of the conjugated diene polymer block ($D^b$) in the block copolymer B.

According to the next process, a coupling agent is added, in an amount of less than 1 molar equivalent of a functional group relative to the active terminal, to the solution containing the aromatic vinyl-conjugated diene block copolymer (i.e., diblock) having an active terminal obtained from the above. Examples of the added coupling agent are the same as those described above. Further, the addition amount of the coupling agent is determined depending on the ratio between the block copolymer A and the block copolymer B which constitute the block copolymer composition. It is not specifically limited if it can give an amount of less than 1 molar equivalent of a functional group of a coupling agent relative to the active terminal of the polymer. In general, it is within the range of 0.10 to 0.90 molar equivalents, and preferably 0.15 to 0.70 molar equivalents of a functional group of a coupling agent relative to the active terminal of the polymer. The condition for coupling reaction is not specifically limited, and it is selected from the range of the polymerization condition described above.

As described above, by adding a coupling agent in an amount of less than 1 molar equivalent of a functional group relative to the active terminal to a solution containing the aromatic vinyl-conjugated diene block copolymer (i.e., diblock) having an active terminal, for only part of the aromatic vinyl-conjugated diene block copolymer (i.e., diblock) having an active terminal, the conjugated diene polymer blocks are bonded to one another via residue of a coupling agent, and as a result, the block copolymer B for the block copolymer composition is produced. The rest of the aromatic vinyl-conjugated diene block copolymer (i.e., diblock) having an active terminal remains unreacted in the solution.

According to the next process, the aromatic vinyl monomer is added to the solution obtained from the above. When the aromatic vinyl monomer is added to the solution, an aromatic vinyl polymer chain is formed from the terminal of the aromatic vinyl-conjugated diene block copolymer (i.e., diblock) having an active terminal, that is left without reacting with the coupling agent. The aromatic vinyl polymer chain will constitute the aromatic vinyl polymer block ($Ar2^a$) having a relatively large weight average molecular weight of the block copolymer A in the block copolymer composition for flexographic printing plates. Thus, the amount of the aromatic vinyl monomer used is determined depending on the target weight average molecular weight of the aromatic vinyl polymer block ($Ar2^a$). According to the process of adding an aromatic vinyl monomer, a non-symmetric aromatic vinyl-conjugated diene-aromatic vinyl block copolymer which constitutes the block copolymer A is formed, and as a result, a solution containing the block copolymer A and the block copolymer B is obtained. Further, before the process of adding an aromatic vinyl monomer, a conjugated diene monomer can be added to a solution containing the aromatic vinyl-conjugated diene block copolymer (i.e., diblock) having an active terminal which remains unreacted with the coupling agent. According to addition of the conjugated diene monomer, the weight average molecular weight of the conjugated diene polymer block ($D^a$) in the block copolymer A can be increased compared to a case in which such monomer is not added.

Under the purpose of having the block copolymer C in the block copolymer composition for flexographic printing plates, it is also possible to have, before the process of adding an aromatic vinyl monomer, a process of adding a polymerization terminator (e.g., water, methanol, ethanol, propanol, hydrochloric acid, and citric acid, etc.) to the solution containing the aromatic vinyl-conjugated diene block copolymer (i.e., diblock) having an active terminal which remains unreacted with the coupling agent, wherein the addition amount of the terminator is less than the equivalent of the active terminal. According to addition of a polymerization terminator, the active terminal of the aromatic vinyl-conjugated diene block copolymer (i.e., diblock) is deactivated, and as a result, the aromatic vinyl-conjugated diene block copolymer (i.e., diblock) obtained therefrom can be included as the block copolymer C in the block copolymer composition for flexographic printing plates. Further, when this process is included, it is necessary that the total addition amount of the functional groups in the coupling agent and the polymerization terminator is less than 1 molar equivalent relative to the active terminal of the aromatic vinyl-conjugated diene block copolymer.

During the next process, the block copolymer composition for flexographic printing plates is recovered from the solution obtained which contains the block copolymer A and the block copolymer B. The method for recovery can be any known method, and it is not specifically limited. For example, recovery can be carried out by adding, if necessary, a polymerization terminator such as water, methanol, ethanol, propanol, hydrochloric acid and citric acid after completion of the reaction, also adding, if necessary, an anti-oxidant, etc., and by performing a known process such as drying or steam stripping directly with the solution. When the block copolymer composition is recovered as a slurry by steam stripping, etc., it is possible that dehydration is carried out by using a dehydrating apparatus such as a compression type squeezer to give a clam having the water content of less than the predetermined amount, and the clam is dried by using any dryer such as a band dryer or expansion extrusion dryer, etc. The block copolymer composition for flexographic printing plates obtained can also be processed into a pellet, etc. and then used.

According to the production method described above, the block copolymer A and the block copolymer B can be continuously obtained in the same reaction vessel, and therefore the target block copolymer composition for flexographic printing plates can be obtained with excellent productivity compared to a case in which each block copolymer is produced separately and mixed with each other. Further, the weight average molecular weight of each polymer block in each block copolymer of the composition has particularly preferable balance required for a block copolymer composition for flexographic printing plates, and therefore a block copolymer composition for flexographic printing plates having excellent balance in wear resistance and rubber elasticity can be obtained.

Further, according to the production method described above, when an alkoxysilane compound which has two or more alkoxy groups in one molecule wherein the alkoxy group is directly bonded to a silicon atom is used as a coupling agent, a polymer component formed with the aromatic vinyl polymer block and conjugated diene polymer block, that is different from any one of the block copolymers A to C, may be contained in the block copolymer composition for flexographic printing plates. With regard to this polymer component, the content of the aromatic vinyl monomer unit relative to the entire monomer units is almost the median of the content of the block copolymer A and the content of the block copolymer B, and the weight average molecular weight is one to three times of the weight average molecular weight of the block copolymer A. The structure of the polymer component is not necessarily clear. However, it is believed to be the block copolymer D having the following Formula (D) based on the reaction mechanism that, as not all of the alkoxy silyl group of the coupling agent reacts with the aromatic vinyl-conjugated diene block copolymer with an active terminal during formation of a coupling block copolymer, part of the alkoxy silyl group remains unreacted, and when the aromatic vinyl-conjugated diene-aromatic vinyl block copolymer having an active terminal is formed after that, the active terminal reacts with the unreacted alkoxy silyl group of the coupling agent.

$$(Ar^b\text{-}D^b)_{n-1}\text{-}X\text{—}Ar2^a\text{-}D^a\text{-}Ar1^a \quad\quad (D)$$

In Formula (D), $Ar2^a$, $Ar^b$ and $D^b$ are the same as those of Formula (A) and Formula (B), X is a residue of a coupling agent, and n is an integer of 2 or more.

By having the polymer component which is presumed as the block copolymer D, the block copolymer composition for flexographic printing plates can have excellent balance in wear resistance and rubber elasticity, and therefore it can have excellent isotropy with little anisotropy exhibited even when a molding method that can easily cause molecular orientation such as extrusion molding is employed. Thus, for producing the block copolymer composition for flexographic printing plates of the invention according to the production method described above, it is particularly preferable to use, as a coupling agent, an alkoxysilane compound which has two or more alkoxy groups in one molecule wherein the alkoxy group is directly bonded to a silicon atom.

The block copolymer composition for flexographic printing plates of the invention as described above has much more excellent wear resistance than conventional polymer compositions for flexographic printing plates, while maintaining sufficient rubber elasticity. Thus, by using the block copolymer composition for flexographic printing plates of the invention, a flexographic printing plate having highly balanced wear resistance and rubber elasticity can be obtained. The method of producing a flexographic printing plate by using the block copolymer composition for flexographic printing plates of the invention is not specifically limited. However, a common method includes preparing it as a photosensitive composition, molding it into a sheet form, and obtaining a flexographic printing plate by photosensitization of the sheet.

Specifically, the composition for photosensitive flexographic printing plates of the invention is constituted with the block copolymer composition for flexographic printing plates of the invention, an ethylenically unsaturated compound having a molecular weight of 5000 or less, and a photopolymerization initiator. The use amount of the block copolymer composition for photosensitive flexographic printing plates is preferably 40 to 95% by weight, and more preferably 50 to 95% by weight relative to the total amount of the block copolymer composition for photosensitive flexographic printing plates and the ethylenically unsaturated compound.

Examples of the ethylenically unsaturated compound having a molecular weight of 5000 or less include diacrylate or dimethacrylate of dihydric alcohol such as ethylene glycol, diethylene glycol, propylene glycol, dipropylene glycol, polyethylene glycol, polypropylene glycol, 1,4-butanediol, and 1,6-hexanediol; triacrylate or trimethacrylate of trimethylolpropane; tetraacrylate or tetramethacrylate of pentaerythritol; N,N'-hexamethylene bisacrylamide, N,N'-hexamethylene bismethacrylamide, diacetone acrylamide, diacetone methacrylamide, styrene, vinyltoluene, divinylbenzene, diarylphthalate, and triaryl cyanurate. It can be used either singly or in combination or two or more.

The use amount of the ethylenically unsaturated compound is preferably 5 to 60% by weight, and more preferably 5 to 50% by weight relative to the total amount of the block copolymer composition for flexographic printing plates and the ethylenically unsaturated compound.

The total amount of the block copolymer composition for flexographic printing plates and the ethylenically unsaturated compound is preferably 50% by weight or more, and more preferably 60% by weight or more, and particularly preferably 70% by weight or more relative to the total amount of the composition for photosensitive flexographic printing plates.

Examples of the photopolymerization initiator include methylhydroquinone, benzophenone, benzoin, benzoin methyl ether, benzoin ethyl ether, benzoin isopropyl ether, benzoin isobutyl ether, α-methylbenzoin, α-methylbenzoin methyl ether, α-methoxybenzoin methyl ether, benzoin phenyl ether, α-t-butylbenzoin, anthraquinone, benzanthraquinone, 2-ethylanthraquinone, 2-chloroanthraquinone, 2-2'-dimethoxydiphenyl acetophenone, 2,2-diethoxyphenyl acetophenone, 2,2-diethoxyacetophenone, and pivaloin. It may be used either singly or as a combination of two or more. The use amount of the photopolymerization initiator is preferably 0.1 to 5% by weight relative to the total amount of the block copolymer composition for flexographic printing plates and the ethylenically unsaturated compound.

In the invention, components other than those described above can be added to the composition for photosensitive flexographic printing plates, if necessary. Such components include, for example, a plasticizer, a heat polymerization inhibitor, an antioxidant, an antiozonant, a dye, a pigment, a filler, an additive showing photochromism, a reducing agent, a chemical agent for improving a relief structure, a crosslinking agent, a fluidity improving agent, and a release agent.

The plasticizer is used usually for the purpose of facilitating production and molding of the composition for photosensitive flexographic printing plates, promoting removal of a light-unexposed part, or controlling the hardness of a light-exposed cured part. Examples of the plasticizer include hydrocarbon oils such as naphthene oil and paraffin oil; liquid 1,2-polybutadiene, liquid 1,4-polybutadiene and hydroxides or carboxylated products thereof; liquid acrylonitrile-butadiene copolymer and carboxylated products thereof; liquid styrene-butadiene copolymer and carboxylated products thereof; and low molecular weight polystyrene having a molecular weight of 3,000 or less, α-methyl styrene-vinyl toluene copolymer, petroleum resin, polyacrylate resin, polyester resin and polyterpene resin. It may be used either singly or as a combination of two or more. Depending on desired properties, the plasticizer is usually added in the range of 2 to 50% by weight in the composition for photosensitive flexographic printing plates.

The heat polymerization inhibitor is used for the purpose of preventing unintended heat polymerization of the ethylenically unsaturated compound in preparation of the composition for photosensitive flexographic printing plates. Examples of the heat polymerization inhibitor include phenols such as hydroquinone, p-methoxy phenol, p-t-butyl catechol, 2,6-di-t-butyl-p-cresol and pyrogallol; quinones such as benzoquinone, p-toluquinone and p-xyloquinone; and amines such as phenyl-α-naphthyl amine. It may be used either singly or as a combination of two or more. The amount of the heat polymerization inhibitor used is usually 0.001 to 2% by weight in the composition for photosensitive flexographic printing plates.

The method of producing the composition for photosensitive flexographic printing plates of the invention is not particularly limited. For example, there is a method of kneading the components constituting the composition by using a kneader, a roll mill, a Banbury mixer, or a single- or twin-screw extruder to produce the composition. The resulting composition is formed usually into a sheet-shaped molded product having a desired thickness by using a molding machine such as a single- or multi-screw extruder, a compression molding machine, or a calender molding machine. When a single- or multi-screw extruder is used, preparation of the composition for photosensitive flexographic printing plates and molding thereof into a sheet-shaped molded product can be simultaneously conducted. Alternatively, the components constituting the composition for photosensitive flexographic printing plates can be dissolved in a suitable solvent such as chloroform, carbon tetrachloride, trichloroethane, diethyl ketone, methyl ethyl ketone, benzene, toluene or tetrahydrofuran, followed by injecting the resulting solution into a frame and evaporating the solvent to produce a sheet-shaped composition for photosensitive flexographic printing plates.

The thickness of the sheet is usually 0.1 to 20 mm, and preferably 1 to 10 mm.

The sheet-shaped composition for photosensitive flexographic printing plates can be provided thereon with a transparent sheet or film including of a resin such as polypropylene, polyethylene or polyethylene terephthalate as abase sheet layer or a protective film layer, in order to prevent pollution or damage of the composition for photosensitive flexographic printing plates during storage or operation.

The surface of the sheet-shaped composition for photosensitive flexographic printing plates may be provided with a highly plastic thin coating layer in order to suppress stickiness on the surface of the composition and to recycle the negative film after exposure to light. In this case, when a light-unexposed part is removed with a solvent after light exposure of the composition for photosensitive flexographic printing plates, the coating layer should also be simultaneously removed. As the coating layer, soluble polyamide and cellulose derivatives are frequently used in general.

The flexographic printing plate of the invention can be obtained by exposing the above composition for photosensitive flexographic printing plates to light.

Production of the flexographic printing plate is usually performed according to the following processes.

(i): The multilayer sheet having a protective film, the sheet-shaped composition layer for photosensitive flexographic printing plates, and a base sheet is irradiated with light at the side of the base sheet, whereby the composition layer for photosensitive flexographic printing plates is cured to specific thickness.

(ii): The protective film is removed, a negative film is adhered to the composition layer for photosensitive flexographic printing plates, and the composition layer is exposed to light of a wavelength of 230 to 450 nm, preferably 350 to 450 nm by irradiating the negative film for light exposure of the composition layer for photosensitive flexographic printing plates. By this light exposure, the light-permeated part of the composition layer for photosensitive flexographic printing plates is cured.

(iii): A light-unexposed part of the composition layer for photosensitive flexographic printing plates remains uncured, so this part can be removed (development).

(iv): In the above (iii), the uncured part is removed usually with a solvent, and thus the solvent remaining in the flexographic printing plate is removed by evaporation.

(v): If necessary, post-light exposure is carried out.

In the development process (removal of the light-unexposed part) in the above (iii), a solvent is usually used. Examples of the solvent include aliphatic hydrocarbons or aromatic hydrocarbons such as n-hexane, n-heptane, octane, petroleum ether, naphtha, limonene, terpene, toluene, xylene, ethyl benzene and isopropyl benzene; ketones such as acetone and methyl ethyl ketone; ethers such as di-n-butyl ether and di-t-butyl ether; esters such as methyl acetate and ethyl acetate; and halogenated hydrocarbons such as methylene chloride, chloroform, trichloroethane, tetrachloroethylene, dichlorotetrafluoroethane and trichlorotrifluoroethane. These may be used either singly or as a combination of two or more thereof. An alcohol such as methanol, ethanol, isopropanol or n-butanol may also be used in a desired amount by adding to the above solvent. The development can be accelerated by applying mechanical strength with a brush or the like in the presence of the solvent.

The flexographic printing plate of the invention has sufficient rubber elasticity and excellent wear resistance. Thus, by using a flexographic printing plate of the invention, repeated printing can be carried out even under strict condition. Further, ink transfer during printing is excellent and flexographic printing can be performed with excellent image quality. The printing material for flexographic printing includes various materials such as paper, corrugated cardboard, wood, metal, polyethylene film, polyethylene sheet, polypropylene film, and polypropylene sheet.

EXAMPLES

Herein below, the invention is described in greater detail with reference to the Examples and the Comparative Examples. "Parts" and "%" in each example are based on weight, unless otherwise specified.

Various measurements were carried out according to the following methods.

[Weight Average Molecular Weight of Block Copolymer and Block Copolymer Composition]

It was obtained in terms of polystyrene based on high speed liquid chromatography which used as a carrier tetrahydrofuran at flow rate of 0.35 ml/min. The apparatus used was HLC8220 (trade name, manufactured by TOSOH CORPORATION), the column used was three Shodex KF-404 HQs (trade name, manufactured by Showa Denko K.K.) connected in series (column temperature of 40° C.), and the detector used was a differential refractometer and a UV detector. Molecular weight was calibrated against 12 points of the standard polystyrene (500 to 3,000,000) provided by Polymer Laboratories Ltd.

[Weight Ratio of Each Block Copolymer]

It was obtained as an area ratio of a peak which corresponded to each block copolymer in the chart obtained by high speed liquid chromatography.

[Weight Average Molecular Weight of Styrene Polymer Block]

According to the method described in Rubber Chem. Technol., 45, 1295(1972), the block copolymer was reacted with ozone followed by reduction with lithium aluminum hydride to dissociate the isoprene polymer block of the block copolymer. Specifically, the dissociation was carried out in the following order. 300 mg of the sample was dissolved in a reaction vessel in which 100 ml of dichloromethane treated with molecular sieve was added. The reaction vessel was then placed in a cooling bath. After adjusting the temperature to −25° C., ozone generated from an ozone generator was introduced thereto while the reaction vessel was purged with oxygen with the flow amount of 170 ml/min. 30 minutes after starting the reaction, completion of the reaction was determined by introducing the gas generated from the reaction vessel to an aqueous solution of potassium iodide. Subsequently, to another reaction vessel substituted with nitrogen, 50 ml of diethyl ether and 470 mg of lithium aluminum hydride were added. To the reaction vessel, the reaction solution reacted with ozone was slowly added dropwise while cooling the reaction vessel in ice water. Thereafter, the reaction vessel was transferred to a water bath and the temperature was slowly increased. The mixture was refluxed at 40° C. for 30 minutes. After that, diluted hydrochloric acid was added dropwise in small portions to the reaction vessel while stirring the solution. The dropwise addition was continued until hydrogen generation almost disappeared. After the reaction, the solid product produced in the solution was filtered off and extracted with 100 ml of diethyl ether for 10 minutes. The resulting extract and the filtrate obtained by the filtration were combined. The solvent was distilled off to give a solid sample. The weight average molecular weight of the solid sample obtained was determined according to the method of measuring the weight average molecular weight described above. The resulting value was taken as the weight average molecular weight of the styrene polymer block.

[Weight Average Molecular Weight of Conjugated Diene Polymer Block]

The weight average molecular weight of the corresponding styrene polymer block was subtracted from each weight average molecular weight of the block copolymer obtained from above, and based on the calculated value, the weight average molecular weight of the conjugated diene polymer block (isoprene polymer block or butadiene polymer block) was obtained.

[Content of Styrene Unit in Block Copolymer]

It was determined based on the detection strength ratio between the differential refractometer and the UV detector for the high speed liquid chromatography measurement above. In addition, copolymers having various contents of styrene unit were prepared in advance, and the calibration curve was established using them.

[Content of Styrene Unit in Block Copolymer Composition]

It was determined based on the proton NMR measurement.

[Vinyl Bond Content in Conjugated Diene Polymer Block]

It was determined based on the proton NMR measurement.

[Tensile Modulus of Composition for Photosensitive Flexographic Printing Plates]

The composition for photosensitive flexographic printing plates was heat-melted at 150° C. by using a biaxial extruder equipped with a T-die and continuously extruded to mold a sheet having a thickness of 2 mm. The detailed condition for sheet molding is as follows.

Composition processing speed: 25 kg/hr
Take-over speed: 1.0 m/min
Extrusion temperature: adjusted to have charge hole temperature of 140° C. and T-die temperature of 160° C.
Screw: full flight
Extruder L/D: 20
T-die: width of 200 mm and lip of 2.5 mm The obtained sheet was irradiated and photosensitized for 10 minutes with active ray using an exposing device equipped with 20 W UV fluorescent lamp (trade name: JE-A3-SS, manufactured by NIHON DENSHI SEIKI CO., LTD.). After that, the sheet was dried at 60° C. for 30 minutes with a hot air dryer. With two photosensitized sheets, one was used for measuring tensile modulus along the melt flow direction during the molding while the other was used for measurement of tensile modulus along the direction perpendicular to the melt flow during the molding. The measurement order is as follows. By using the TENSILON Universal Tester RTC-1210 (trade name, manufactured by ORIENTEC Co., Ltd.), the sheet was elongated to 100% with tensile rate of 300 mm/min, and the tensile stress at 100% elongation was measured during the process to obtain tensile modulus of the sheet at 100% elongation. As the ratio of (tensile modulus along the melt flow direction/tensile modulus along the direction perpendicular to the melt flow) approaches 1, anisotropy becomes smaller while isotropy becomes more excellent.

[Tensile Modulus of Composition for Photosensitive Flexographic Printing Plates]

According to the same method as the method for measuring tensile modulus above, a sheet with the photosensitized composition for photosensitive flexographic printing plates was prepared. Using this sheet, the permanent elongation was measured with the TENSILON Universal Tester above with reference to ASTM 412. Specifically, by using Die A for the sample shape, the sheet was elongated with the elongation ratio of 200% with a distance of 40 mm between marked lines before elongation. After maintaining the sheet in the state for 10 minutes, the sheet was rapidly shrunken without any turnover, and maintained again in the state for 10 minutes. Then, the distance between the marked lines was measured, and the permanent elongation was calculated based on the following equation. The smaller permanent elongation value indicates higher rubber elasticity.

$$\text{Permanent elongation (\%)} = (L1-L0)/L0 \times 100$$

L0: distance between marked lines before elongation (mm)
L1: distance between marked lines 10 minutes after shrinking (mm)

The measurement was carried out by using two sheets, i.e., one was used for measurement along the melt flow direction and the other was used for measurement along the direction perpendicular to the melt flow, and each value obtained was recorded.

[Wear Resistance of Composition for Photosensitive Flexographic Printing Plates]

According to the same method as the method for measuring tensile modulus above, a sheet with the photosensitized composition for photosensitive flexographic printing plates was prepared. Subsequently, the obtained sheet and a number 1000 water-resistant paper were subjected to reciprocating abrasion using HEIDON abrasion tester (trade name, manufactured by SHINTO Scientific Co., Ltd.) under the condition including a load of 100 g and a speed of 6000 mm/sec. After 1000 cycles, the abrasion amount of the sheet surface was measured, which is expressed as an index value when the value obtained from Example 6 is taken as 100. The higher index value indicates better wear resistance.

Preparation Example 1

To a pressure-resistant reactor, 23.3 kg of cyclohexane, 2.5 millimoles of N,N,N',N'-tetramethyl ethylene diamine (herein below, referred to as TMEDA) and 1.55 kg of styrene were added and stirred at 40° C. Added thereto was 164.7 millimoles of n-butyl lithium, and while the temperature was increased to 50° C., the mixture was polymerized for 1 hour. The degree of polymerization conversion of styrene in this stage was 100%. Subsequently, 5.20 kg of isoprene was added to the reactor continuously over 1 hour while the temperature was controlled to maintain 50 to 60° C. After the addition of isoprene was finished, the mixture was polymerized for additional 1 hour. The degree of polymerization conversion of isoprene was 100%. Subsequently, 60.1 millimoles of dimethyl dimethoxysilane was added thereto as a coupling agent and the coupling reaction was performed for 2 hours to produce a styrene-isoprene-styrene block copolymer, which would be the block copolymer B. Next, 23.1 millimoles of methanol was added to the reactor to deactivate the active terminal of part of the styrene-isoprene block copolymer. After that, while the temperature was controlled such that it was kept at 50 to 60° C., 3.25 kg of styrene was continuously added over 1 hour. After the addition of styrene was completed, the polymerization was performed for additional 1 hour to produce a styrene-isoprene-styrene block copolymer, which would be the block copolymer A. The degree of polymerization conversion of styrene was 100%. After that, 329.4 millimoles of methanol was added as a polymerization terminator and mixed well to terminate the reaction. The amount of each reagent used for the reaction is shown in Table 1. Part of the reaction solution obtained was extracted and the weight average molecular weight of each block copolymer and block copolymer composition, the weight average molecular weight of each styrene polymer block, the weight average molecular weight of each isoprene polymer block, the content of the styrene unit in each block copolymer, the content of the styrene unit in the block copolymer composition, the vinyl bond content in the isoprene polymer block, and the weight ratio of each block copolymer were measured. The results are shown in Table 2. To 100 parts of the reaction solution obtained (containing 30 parts of polymer components), 0.3 part of 2,6-di-tert-butyl-p-cresol was added as an anti-oxidant and mixed well. The mixture solution was added dropwise in small portions to hot water heated to 85 to 95° C. to evaporate the solvent. Accordingly, the precipitates were obtained, pulverized, and dried with hot air (85° C.) to recover the block copolymer composition of Preparation example 1.

TABLE 1

| | Preparation example | | | | | | | | | |
|---|---|---|---|---|---|---|---|---|---|---|
| | 1 | 2 | 3 | 4 | 5 | 6 | 7 | 8 | 9 | 10 |
| Cyclohexane (kg) | 23.3 | 23.3 | 23.3 | 23.3 | 23.3 | 23.3 | 23.3 | 23.3 | 23.3 | 23.3 |
| TMEDA (millimoles) | 2.5 | 2.2 | 1.9 | 0.8 | 2.6 | 1.3 | 1.9 | 2.3 | 1.2 | 1.82 |
| n-Butyl lithium (millimoles) | 164.7 | 147.7 | 129.3 | 14.1 | 172.4 | 90.0 | 128.8 | 156.0 | 77.9 | 121.5 |
| Styrene (kg) [First polymerization step] | 1.55 | 1.49 | 1.16 | 1.24 | 1.90 | 0.90 | 1.50 | 2.20 | 4.15 | 1.25 |
| n-Butyl lithium (millimoles) [First polymerization step-readdition] | — | — | — | 43.2 | — | — | — | — | — | — |
| Styrene (kg) [First polymerization step-readdition] | — | — | — | 0.85 | — | — | — | — | — | — |
| Isoprene (kg) [Second polymerization step] | 5.20 | 5.60 | 5.30 | 7.05 | 8.10 | 8.20 | 7.00 | 5.60 | 5.20 | — |
| Butadiene (kg) [Second polymerization step] | — | — | — | — | — | — | — | — | — | 7.50 |
| Dimethyl dimethoxysilane (millimoles) [After second polymerization step] | 60.1 | — | — | — | — | — | — | — | — | — |
| Tetramethoxysilane (millimoles) [After second polymerization step] | — | 28.7 | 16.2 | — | 34.5 | — | — | — | — | — |
| Methanol (millimoles) [After second polymerization step] | 23.1 | 31.0 | 18.1 | — | — | — | — | — | — | — |
| Styrene (kg) [Third polymerization step] | 3.25 | 2.91 | 3.54 | 0.86 | — | 0.90 | 1.50 | 2.20 | 0.65 | 1.25 |
| Methanol (millimoles) [After third polymerization step] | 329.4 | 295.4 | 258.6 | 114.6 | 344.8 | 180.0 | 257.6 | 312.0 | 155.9 | 243.0 |

TABLE 2

| | Preparation example | | | | | | | | | |
|---|---|---|---|---|---|---|---|---|---|---|
| | 1 | 2 | 3 | 4 | 5 | 6 | 7 | 8 | 9 | 10 |
| block copolymer A | | | | | | | | | | |
| relatively small styrene block (Arl$^a$) weight average molecular weight [Mw (Arl$^a$)] | 10000 | 9000 | 9000 | 12000 | — | — | — | — | 15000 | — |
| relatively large styrene block (Ar2$^a$) weight average molecular weight [Mw (Ar2$^a$)] | 153000 | 123000 | 57000 | 100000 | — | — | — | — | 76000 | — |
| Mw (Ar2$^a$)/Mw (Arl$^a$) | 15.3 | 13.7 | 6.3 | 8.3 | — | — | — | — | 5.1 | — |
| isoprene block (D$^a$) weight average molecular weight | 70000 | 62000 | 59000 | 123000 | — | — | — | — | 133000 | — |
| isoprene block (D$^a$) vinyl bond content (%) | 7 | 7 | 7 | 9 | — | — | — | — | 7 | — |
| weight average molecular weight of block copolymer A | 215000 | 198000 | 124000 | 235000 | — | — | — | — | 224000 | — |
| styrene unit content of the block copolymer A (%) | 76 | 54 | 59 | 53 | — | — | — | — | 48 | — |
| block copolymer B | | | | | | | | | | |
| styrene block (Ar$^b$) weight average molecular weight | 10000 | 9000 | 9000 | 12000 | 11000 | 10000 | 13000 | 15000 | — | 11000 |
| structural unit of conjugated diene polymer block | isoprene | isoprene | isoprene | isoprene | isoprene | isoprene | isoprene | isoprene | | butadiene |
| conjugated diene polymer block (D$^b$) weight average molecular weight | 70000 | 62000 | 59000 | 123000 | 70000 | 50000 | 45000 | 30000 | — | 50000 |
| conjugated diene polymer block (D$^b$) vinyl bond content (%) (%) | 7 | 7 | 7 | 9 | 7 | 7 | 7 | 7 | — | 11 |
| weight average molecular weight of block copolymer B | 117000 | 284000 | 276000 | 147000 | 270000 | 120000 | 116000 | 90000 | — | 125000 |
| styrene unit content of block copolymer B (%) | 17 | 21 | 18 | 19 | 19 | 18 | 30 | 44 | — | 25 |
| block copolymer A/block copolymer B (weight ratio) | 52/48 | 80/20 | 78/22 | 34/66 | — | — | — | — | — | — |
| block copolymer C | | | | | | | | | | |
| styrene block (Ar$^c$) weight average molecular weight | 10000 | 9000 | 9000 | — | 11000 | — | — | — | — | — |
| isoprene block (D$^c$) weight average molecular weight | 71000 | 62000 | 59000 | — | 71000 | — | — | — | — | — |
| ratio in entire block copolymer composition (%) | 10 | 11 | 10 | 0 | 28 | 0 | 0 | 0 | 0 | 0 |
| polymer component expected as block copolymer D | | | | | | | | | | |
| weight average molecular weight | 230000 | 390000 | 320000 | — | — | — | — | — | — | — |
| styrene unit content (%) | 55 | 43 | 38 | — | — | — | — | — | — | — |
| ratio in entire block copolymer composition (%) | 10 | 9 | 9 | 0 | 0 | 0 | 0 | 0 | 0 | 0 |
| block copolymer composition (whole) | | | | | | | | | | |
| weight average molecular weight | 149000 | 215000 | 128000 | 175000 | 214000 | 120000 | 116000 | 90000 | 224000 | 125000 |
| styrene unit content (%) | 48 | 44 | 47 | 30 | 19 | 18 | 30 | 44 | 48 | 25 |

Preparation Example 2

Except that 28.7 millimoles of tetramethoxysilane was used as a coupling agent instead of 60.1 millimoles of dimethyl dimethoxysilane and the amount of each of styrene, n-butyl lithium, TMEDA, isoprene, and methanol was changed to those described in Table 1, the block copolymer composition of Preparation example 2 was recovered in the same manner as Preparation example 1. The block copolymer composition of Preparation example 2 was subjected to the same measurements as Preparation example 1. The results are shown in Table 2.

Preparation Example 3

Except that the amount of each of styrene, n-butyl lithium, TMEDA, isoprene, tetramethoxysilane, and methanol was changed to those described in Table 1, the block copolymer composition of Preparation example 3 was recovered in the same manner as Preparation example 2. The block copolymer composition of Preparation example 3 was subjected to the same measurements as Preparation example 1. The results are shown in Table 2.

Preparation Example 4

To a pressure-resistant reactor, 23.3 kg of cyclohexane, 0.8 millimoles of TMEDA and 1.24 kg of styrene were added and stirred at 40° C. Added thereto was 14.1 millimoles of n-butyl lithium, and while the temperature was increased to 50° C., the mixture was polymerized for 1 hour. Next, 43.2 millimoles of n-butyl lithium was further added thereto, and 0.85 kg of isoprene was added thereto continuously over 30 minutes and the polymerization was performed for 1 hour. The degree of polymerization conversion of styrene was 100%. Subsequently, 7.05 kg of isoprene was added to the reactor continuously over 1 hour while the temperature was controlled to maintain 50 to 60° C. After the addition of isoprene was completed, the polymerization was performed for additional 1 hour. The degree of polymerization conversion of isoprene was 100%. Subsequently, 0.85 kg of styrene was added thereto continuously over 30 minutes. After the addition of styrene was completed, the polymerization was performed for additional 1 hour to produce two kinds of styrene-isoprene-styrene block copolymers, which are the block copolymer A and the block copolymer B. The degree of polymerization conversion of styrene was 100%. After that, 114.6 millimoles of methanol was added as a polymerization terminator and mixed well to terminate the reaction. Part of the reaction solution obtained was extracted and subjected to the same measurements as Preparation example 1. The values thereof are shown in Table 2. Subsequent treatments that were the same as those of Preparation example 1 were carried out to recover the block copolymer composition of Preparation example 4.

Preparation Example 5

To a pressure-resistant reactor, 23.3 kg of cyclohexane, 2.6 millimoles of TMEDA and 1.90 kg of styrene were added and stirred at 40° C. Added thereto was 172.9 millimoles of n-butyl lithium, and while the temperature was increased to 50° C., the mixture was polymerized for 1 hour. The degree of polymerization conversion of styrene was 100%. Subsequently, 8.10 kg of isoprene was added to the reactor continuously over 1 hour while the temperature was controlled to maintain 50 to 60° C. After the addition of isoprene was completed, the polymerization was performed for additional 1 hour. The degree of polymerization conversion of isoprene was 100%. Subsequently, 34.5 millimoles of tetramethoxysilane was added as a coupling agent and the coupling reaction was performed for 2 hours to form a branched styrene-isoprene-styrene block copolymer, which would be the block copolymer B. After that, 344.8 millimoles of methanol was added as a polymerization terminator to the solution in which the styrene-isoprene block copolymer having an active terminal remained and mixed well to terminate the reaction. Part of the reaction solution obtained was extracted and subjected to the same measurements as Preparation example 1. The values thereof are shown in Table 2. Subsequent treatments that were the same as those of Preparation example 1 were carried out to recover the block copolymer composition of Preparation example 5.

Preparation Example 6

To a pressure-resistant reactor, 23.3 kg of cyclohexane, 1.3 millimoles of TMEDA and 0.90 kg of styrene were added and stirred at 40° C. Added thereto was 90.0 millimoles of n-butyl lithium, and while the temperature was increased to 50° C., the mixture was polymerized for 1 hour. The degree of polymerization conversion of styrene was 100%. Subsequently, 8.10 kg of isoprene was added to the reactor continuously over 1 hour while the temperature was controlled to maintain 50 to 60° C. After the addition of isoprene was completed, the polymerization was performed for additional 1 hour. The degree of polymerization conversion of isoprene was 100%. Subsequently, 0.90 kg of styrene was added thereto continuously over 1 hour while the temperature was controlled to maintain 50 to 60° C. After the addition of styrene was completed, the polymerization was performed for additional 1 hour to produce a styrene-isoprene-styrene block copolymer. The degree of polymerization conversion of styrene was 100%. After that, 180.0 millimoles of methanol was added as a polymerization terminator and mixed well to terminate the reaction. Part of the reaction solution obtained was extracted and subjected to the same measurements as Preparation example 1. The values thereof are shown in Table 2. Subsequent treatments that were the same as those of Preparation example 1 were carried out to recover the block copolymer composition of Preparation example 6.

Preparation Examples 7 to 9

Except that the amount of each of styrene, n-butyl lithium, TMEDA, isoprene, and methanol was changed to those described in Table 1, the block copolymer compositions of Preparation examples 7 to 9 were recovered in the same manner as Preparation example 6. The block copolymer compositions of Preparation examples 7 to 9 were subjected to the same measurements as Preparation example 1. The results are shown in Table 2.

Preparation Example 10

Except that 7.50 kg of butadiene was used instead of 8.20 kg of isoprene and the amount of each of styrene, n-butyl lithium, TMEDA, and methanol was changed to those described in Table 1, the block copolymer composition of Preparation example 10 was recovered in the same manner as Preparation example 6. The block copolymer composition of Preparation example 10 was subjected to the same measurements as Preparation example 1. The results are shown in Table 2.

Example 1

Kneaded at 170° C. using a kneader were 100 parts of the block copolymer composition of Preparation example 1, 10 parts of liquid polybutadiene (trade name: NISSO-PB-B-1000, manufactured by Nippon Soda Co., Ltd.), and 2 parts of 2,6-di-t-butyl-p-cresol. Subsequently, the kneading temperature was lowered to 130° C., and 5 parts of 1,4-butanediol diacrylate, 5 parts of 1,6-hexanediol dimethacrylate, 0.01 part of methylhydroquinone, and 0.8 part of benzoin isopropyl ether were added and kneaded to obtain the composition for photosensitive flexographic printing plates of Example 1. The composition for photosensitive flexographic printing plates was used for measurement of tensile modulus, permanent elongation, and wear resistance. The results are given in Table 3.

TABLE 3

| | | Example 1 | Example 2 | Example 3 | Example 4 | Example 5 | Example 6 | Comparative example 1 | Comparative example 2 | Comparative example 3 | Comparative example 4 |
|---|---|---|---|---|---|---|---|---|---|---|---|
| Mix Proportion (parts) | | | | | | | | | | | |
| Block copolymer composition | Preparation example 1 | 100 | — | — | — | — | — | — | — | — | — |
| | Preparation example 2 | — | 100 | — | — | — | — | — | — | — | — |

TABLE 3-continued

|  | Example 1 | Example 2 | Example 3 | Example 4 | Example 5 | Example 6 | Comparative example 1 | Comparative example 2 | Comparative example 3 | Comparative example 4 |
|---|---|---|---|---|---|---|---|---|---|---|
| Preparation example 3 | — | — | 100 | — | — | — | — | — | — | — |
| Preparation example 4 | — | — | — | 100 | — | — | — | — | — | — |
| Preparation example 5 | — | — | — | — | 50 | — | — | — | — | — |
| Preparation example 6 | — | — | — | — | — | 50 | — | — | — | — |
| Preparation example 7 | — | — | — | — | — | — | 100 | — | — | — |
| Preparation example 8 | — | — | — | — | — | — | — | 100 | — | — |
| Preparation example 9 | — | — | — | — | 50 | 50 | — | — | 100 | — |
| Preparation example 10 | — | — | — | — | — | — | — | — | — | 100 |
| Weight average molecular weight as a whole | 149000 | 215000 | 128000 | 175000 | 220000 | 172000 | 116000 | 90000 | 224000 | 125000 |
| Styrene unit content as a whole (%) | 48 | 44 | 47 | 30 | 34 | 33 | 30 | 44 | 48 | 25 |
| Performance |  |  |  |  |  |  |  |  |  |  |
| Perpendicular direction to melt flow 100% Tensile modulus (Mpa) | 1.44 | 1.25 | 1.22 | 0.61 | 0.71 | 0.78 | 0.83 | 3.79 | 5.27 | 0.63 |
| Perpendicular direction to melt flow Permanent elongation (%) | 4 | 4 | 5 | 5 | 4 | 2 | 5 | 14 | 60 | 8 |
| Melt flow direction 100% Tensile modulus (MPa) | 1.71 | 1.40 | 1.55 | 1.10 | 0.75 | 0.89 | 3.71 | 4.95 | 6.53 | 2.3 |
| Melt flow direction Permanent elongation (%) | 5 | 5 | 7 | 9 | 6 | 5 | 4.5 | 15 | 65 | 12 |
| Melt flow direction/Perpendicular direction to melt flow Ratio of tensile modulus | 1.2 | 1.1 | 1.3 | 1.8 | 1.1 | 1.1 | 12 | 1.3 | 1.2 | 3.7 |
| Wear resistance (index value) | 150 | 165 | 155 | 90 | 105 | 100 | 85 | 150 | 170 | 90 |

Examples 2 to 4

Except that the block copolymer composition used was changed to the block copolymer compositions of Preparation examples 2 to 4, the compositions for photosensitive flexographic printing plates of Examples 2 to 4 were obtained in the same manner as Example 1. The compositions for photosensitive flexographic printing plates of Examples 2 to 4 were used for measurement of tensile modulus, permanent elongation, and wear resistance. The results are given in Table 3.

Example 5

Except that 100 parts of the block copolymer composition of Preparation example 1 was changed to 50 parts of the block copolymer composition of Preparation example 5 and 50 parts of the block copolymer composition of Preparation example 9, the composition for photosensitive flexographic printing plates of Example 5 was obtained in the same manner as Example 1. The composition for photosensitive flexographic printing plates of Example 5 was used for measurement of tensile modulus, permanent elongation, and wear resistance. The results are given in Table 3.

Example 6

Except that 100 parts of the block copolymer composition of Preparation example 1 was changed to 50 parts of the block copolymer composition of Preparation example 6 and 50 parts of the block copolymer composition of Preparation example 9, the composition for photosensitive flexographic printing plates of Example 6 was obtained in the same manner as Example 1. The composition for photosensitive flexographic printing plates of Example 6 was used for measurement of tensile modulus, permanent elongation, and wear resistance. The results are given in Table 3.

Comparative examples 1 to 4

Except that the block copolymer composition used was changed to the block copolymer compositions of Preparation examples 7 to 10, the compositions for photosensitive flexographic printing plates of Comparative examples 1 to 4 were obtained in the same manner as Example 1. The compositions for photosensitive flexographic printing plates of Comparative examples 1 to 4 were used for measurement of tensile modulus, permanent elongation, and wear resistance. The results are given in Table 3.

From Table 3, the followings are found. First, the composition for photosensitive flexographic printing plates of the invention that is obtained from the block copolymer composition for flexographic printing plates of the invention has low permanent elongation and high wear resistance, and it can be said the composition has excellent rubber elasticity and wear resistance as well as excellent isotropy (Examples 1 to 6). Further, when the block copolymer composition for flexographic printing plates containing the styrene-isoprene block copolymer(the block copolymer C) (i.e., Examples 1 to 3 and 5) or the block copolymer composition for flexographic printing plates having tetramethoxysilane as a coupling agent (i.e., Examples 1 to 3) was used, a block copolymer composition for flexographic printing plates having particularly excellent balance in rubber elasticity and wear resistance as well as excellent isotropy was obtained. On the other hand, when a block copolymer composition not belonging to the block copolymer composition for flexographic printing plates of the invention was used (i.e., Comparative examples 1 to 4), balance in rubber elasticity and wear resistance was poor and anisotropy was shown.

The invention claimed is:

1. A block copolymer composition for flexographic printing plates, comprising a block copolymer A represented by the following Formula (A) and a block copolymer B represented by the following Formula (B), wherein a content of an aromatic vinyl monomer unit in the block copolymer A is 41% by weight or more:

$$Ar1^a\text{-}D^a\text{-}Ar2^a \quad (A)$$

$$(Ar^b\text{-}D^b)_n\text{-}X \quad (B),$$

wherein, in the Formulae (A) and (B), $Ar1^a$ and $Ar^b$ each are an aromatic vinyl polymer block with a weight average molecular weight of 6000 to 20000, $Ar2^a$ is an aromatic vinyl polymer block with a weight average molecular weight of 40000 to 400000, $D^a$ and $D^b$ each are a conjugated diene polymer block with a vinyl bond content of 1 to 20 mol %, X is a single bond or a residue of a coupling agent, and n is an integer of 2 or more.

2. The block copolymer composition for flexographic printing plates according to claim 1, wherein a ratio of the aromatic vinyl monomer unit relative to entire monomer units constituting a polymer component of the block copolymer composition for flexographic printing plates is 20 to 70% by weight.

3. The block copolymer composition for flexographic printing plates according to claim 1, wherein a weight ratio (A/B) between the block copolymer A and the block copolymer B is from 36/64 to 85/15.

4. The block copolymer composition for flexographic printing plates according to claim 1, further comprising a block copolymer C represented by the following Formula (C):

$$Ar^c\text{-}D^c \quad (C),$$

wherein, in Formula (C), $Ar^c$ is an aromatic vinyl polymer block with a weight average molecular weight of 6000 to 20000 and $D^c$ is a conjugated diene polymer block with a vinyl bond content of 1 to 20 mol %.

5. The block copolymer composition for flexographic printing plates according to claim 1, wherein the block copolymer B is obtained by using, as the coupling agent, a compound having two or more functional groups in one molecule and the functional group is at least one selected from an alkoxyl group, an ester group, and an epoxy group.

6. A composition for photosensitive flexographic printing plates, comprising the block copolymer composition for flexographic printing plates according to claim 1, an ethylenically unsaturated compound with a molecular weight of 5000 or less, and a photopolymerization initiator.

7. A flexographic printing plate obtained by using the composition for photosensitive flexographic printing plates according to claim 6.

* * * * *

UNITED STATES PATENT AND TRADEMARK OFFICE
CERTIFICATE OF CORRECTION

PATENT NO. : 8,578,852 B2
APPLICATION NO. : 13/138493
DATED : November 12, 2013
INVENTOR(S) : Tetsuaki Matsubara et al.

Page 1 of 1

It is certified that error appears in the above-identified patent and that said Letters Patent is hereby corrected as shown below:

ON THE TITLE PAGE:

At item (45), Date of Patent, change "Nov. 12, 2013" to -- *Nov. 12, 2013 --.

At item (*), please correct the Notice to read as follows:

-- (*) Notice: Subject to any disclaimer, the term of this patent is extended or adjusted under 35 U.S.C. 154(b) by 66 days.

This patent is subject to a terminal disclaimer. --.

Signed and Sealed this
First Day of April, 2014

Michelle K. Lee
*Deputy Director of the United States Patent and Trademark Office*